(12) United States Patent
Tanaka et al.

(10) Patent No.: US 12,506,052 B2
(45) Date of Patent: Dec. 23, 2025

(54) SEMICONDUCTOR DEVICE AND POWER CONVERSION DEVICE

(71) Applicant: Mitsubishi Electric Corporation, Tokyo (JP)

(72) Inventors: Yo Tanaka, Tokyo (JP); Masakazu Tani, Tokyo (JP); Tomohisa Yamane, Tokyo (JP); Katsuhisa Kodama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 771 days.

(21) Appl. No.: 17/851,499

(22) Filed: Jun. 28, 2022

(65) Prior Publication Data

US 2023/0187322 A1 Jun. 15, 2023

(30) Foreign Application Priority Data

Dec. 14, 2021 (JP) .................................. 2021-202178

(51) Int. Cl.
*H01L 23/495* (2006.01)
*H01L 23/00* (2006.01)
(Continued)

(52) U.S. Cl.
CPC .. *H01L 23/49524* (2013.01); *H01L 23/49562* (2013.01); *H01L 23/49575* (2013.01);
(Continued)

(58) Field of Classification Search
None
See application file for complete search history.

(56) References Cited

U.S. PATENT DOCUMENTS 8,836,103 B2 * 9/2014 Nishi .................... H01L 23/473
257/691
2017/0345799 A1 11/2017 Rowden et al.
(Continued)

FOREIGN PATENT DOCUMENTS

JP 2019-517733 A 6/2019
JP 6786416 B2 11/2020
(Continued)

OTHER PUBLICATIONS

Communication dated Mar. 7, 2023, issued in Japanese Application No. 2021-202178.

*Primary Examiner* — Nishath Yasmeen
(74) *Attorney, Agent, or Firm* — Sughrue Mion, PLLC

(57) ABSTRACT

In this power semiconductor module, a first lead frame and a second lead frame through which currents flow in opposite directions are arranged so as to overlap each other, whereby the internal inductance can be reduced. In a direction perpendicular to one main surface of a first metal wiring layer, each of the first lead frame and the second lead frame is provided so as not to overlap parts of end surfaces of the first metal wiring layer and a second metal wiring layer. Thus, in a manufacturing process for the power semiconductor module before sealing with sealing resin, it is possible to easily perform positioning between the lead frames and between the metal wiring layer and the lead frame, using the end surfaces, whereby the manufacturing process can be simplified.

13 Claims, 6 Drawing Sheets

(51) Int. Cl.
  *H01L 23/31*   (2006.01)
  *H01L 25/07*   (2006.01)
  *H01L 25/18*   (2023.01)

(52) U.S. Cl.
  CPC .............. *H01L 24/37* (2013.01); *H01L 24/40* (2013.01); *H01L 23/3121* (2013.01); *H01L 23/49513* (2013.01); *H01L 24/73* (2013.01); *H01L 25/072* (2013.01); *H01L 25/18* (2013.01); *H01L 2224/29111* (2013.01); *H01L 2224/29116* (2013.01); *H01L 2224/2929* (2013.01); *H01L 2224/29339* (2013.01); *H01L 2224/37013* (2013.01); *H01L 2224/37124* (2013.01); *H01L 2224/37147* (2013.01); *H01L 2224/40137* (2013.01); *H01L 2224/40175* (2013.01); *H01L 2224/40499* (2013.01); *H01L 2224/73263* (2013.01); *H01L 2924/014* (2013.01); *H01L 2924/0665* (2013.01)

(56) References Cited

U.S. PATENT DOCUMENTS

| | | |
|---|---|---|
| 2018/0240732 A1 | 8/2018 | Tonedachi |
| 2019/0051636 A1 | 2/2019 | Tonedachi |
| 2019/0237440 A1 | 8/2019 | Rowden et al. |

FOREIGN PATENT DOCUMENTS

| | | | |
|---|---|---|---|
| JP | 2021-34638 A | | 3/2021 |
| JP | 2021034638 A | * | 3/2021 |

* cited by examiner

SEMICONDUCTOR DEVICE AND POWER CONVERSION DEVICE

BACKGROUND OF THE INVENTION

1. Field of the Invention

The present disclosure relates to a semiconductor device and a power conversion device.

2. Description of the Background Art

In a power semiconductor module, if the internal inductance is great, overvoltage occurs when switching is performed at a high speed, so that the module might be broken. Therefore, switching of a power semiconductor element cannot be performed at a high speed, resulting in increase in switching loss. Thus, in order to achieve high-speed switching and reduction in switching loss, it is necessary to reduce the inductance inside the power semiconductor module.

As a structure for reducing the inductance inside the power semiconductor power module, it is known that a plurality of wiring members or metal wiring layers through which currents flow in opposite directions are arranged in an overlapping manner. For example, in Patent Document 1, an N metal wiring layer and a P metal wiring layer through which currents flow in opposite directions are arranged so as to overlap each other in the up-down direction, whereby inductances are canceled out with each other in this area and the inductance inside the power semiconductor module is reduced.

Patent Document 1: Japanese Patent No. 6786416

However, in the semiconductor module with the plurality of wiring members or metal wiring layers arranged in an overlapping manner as in Patent Document 1, at the time of manufacturing, the positional relationship between the wiring members and the positional relationship between the metal wiring layer and the wiring member are unclear in a top view, and thus it might be difficult to confirm these positional relationships. In this case, an accurate positioning technique is needed in a joining process between the metal wiring layer and the wiring member, a resin sealing process, and the like, thus causing a problem that the manufacturing process is complicated.

SUMMARY OF THE INVENTION

The present disclosure has been made to solve the above problem, and an object of the present disclosure is to provide a semiconductor device that enables reduction in the internal inductance and can achieve simplification of the manufacturing process, and a power conversion device including such a semiconductor device.

A semiconductor device according to the present disclosure includes: a first metal wiring layer and a second metal wiring layer having planar shapes and arranged side by side with each other, the first metal wiring layer and the second metal wiring layer each having two main surfaces opposed to each other and four end surfaces connecting the two main surfaces; a first power semiconductor element joined to one main surface of the first metal wiring layer; a second power semiconductor element joined to one main surface of the second metal wiring layer that is located on the same side as the one main surface of the first metal wiring layer; a wiring member joined to one or more of the first metal wiring layer, the second metal wiring layer, the first power semiconductor element, and the second power semiconductor element; and a sealing resin that seals the first metal wiring layer, the second metal wiring layer, the first power semiconductor element, the second power semiconductor element, and at least a part of the wiring member. The wiring member includes a first lead frame having one end joined to the one main surface of the second metal wiring layer and another end joined to a surface electrode of the first power semiconductor element, and a second lead frame having one end joined to a surface electrode of the second power semiconductor element and another end exposed from the sealing resin. In a direction perpendicular to the one main surface of the first metal wiring layer, the first lead frame is provided between the second lead frame and the first power semiconductor element, and each of the first lead frame and the second lead frame is provided so as not to overlap parts of the end surfaces of the first metal wiring layer and the second metal wiring layer.

A power conversion device according to the present disclosure includes: a main conversion circuit which includes the semiconductor device according to the present disclosure and which converts inputted power and outputs resultant power; and a control circuit which outputs a control signal for controlling the main conversion circuit, to the main conversion circuit.

In the semiconductor device according to the present disclosure, the first lead frame and the second lead frame are arranged so as to overlap each other in the direction perpendicular to the one main surface of the first metal wiring layer, whereby the internal inductance can be reduced. In addition, in the direction perpendicular to the one main surface of the first metal wiring layer, each of the first lead frame and the second lead frame is provided so as not to overlap parts of the end surfaces of the first metal wiring layer and the second metal wiring layer. Thus, in a manufacturing process for the semiconductor device before sealing with the sealing resin, it is possible to easily perform positioning between the lead frames and between the metal wiring layer and the lead frame, using the end surfaces, whereby the manufacturing process can be simplified.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

First Embodiment

Figure 1:
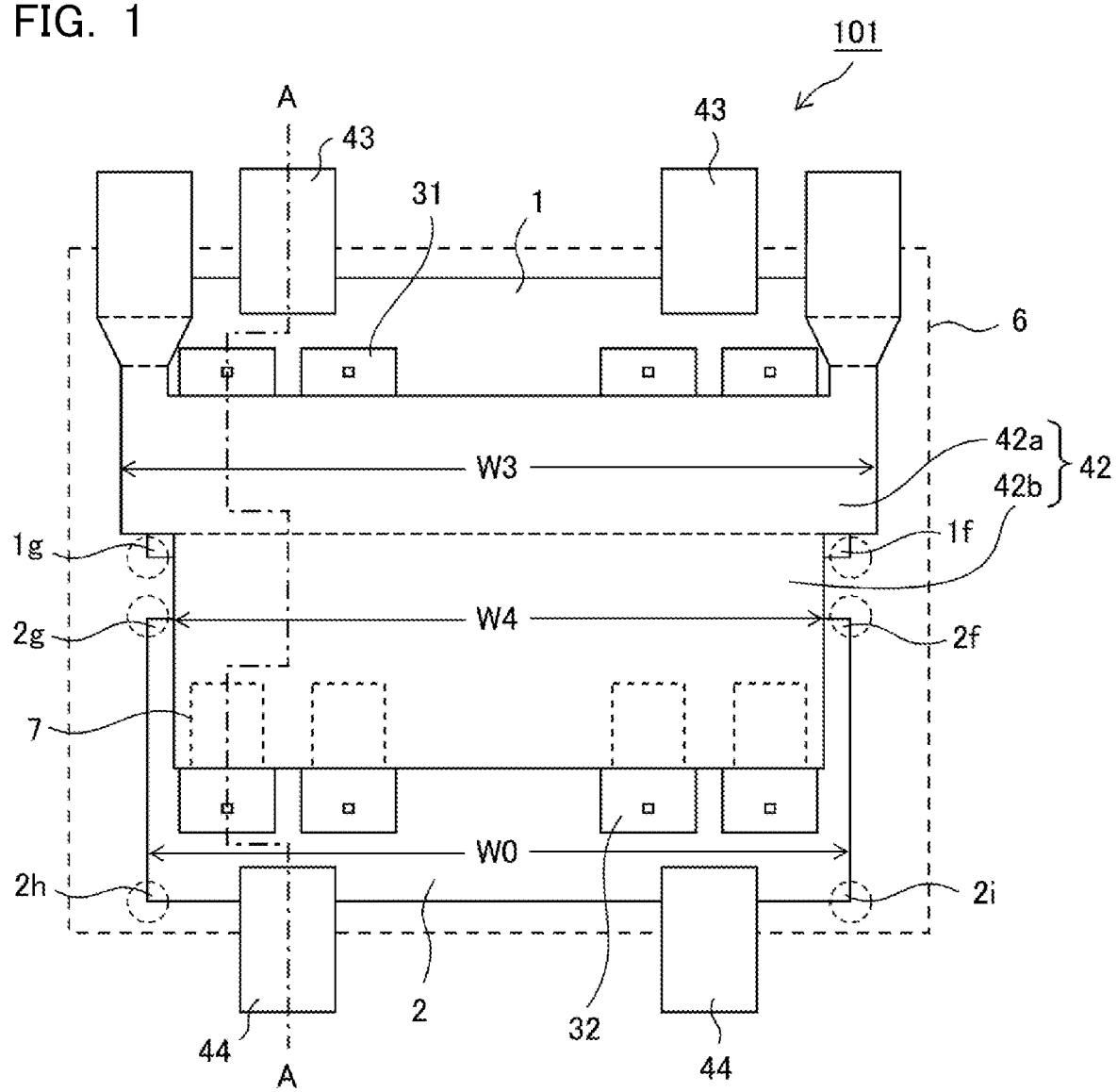
FIG. 1 is a plan view showing a schematic structure of a power semiconductor module according to the first embodiment of the present disclosure.
Figure 2:
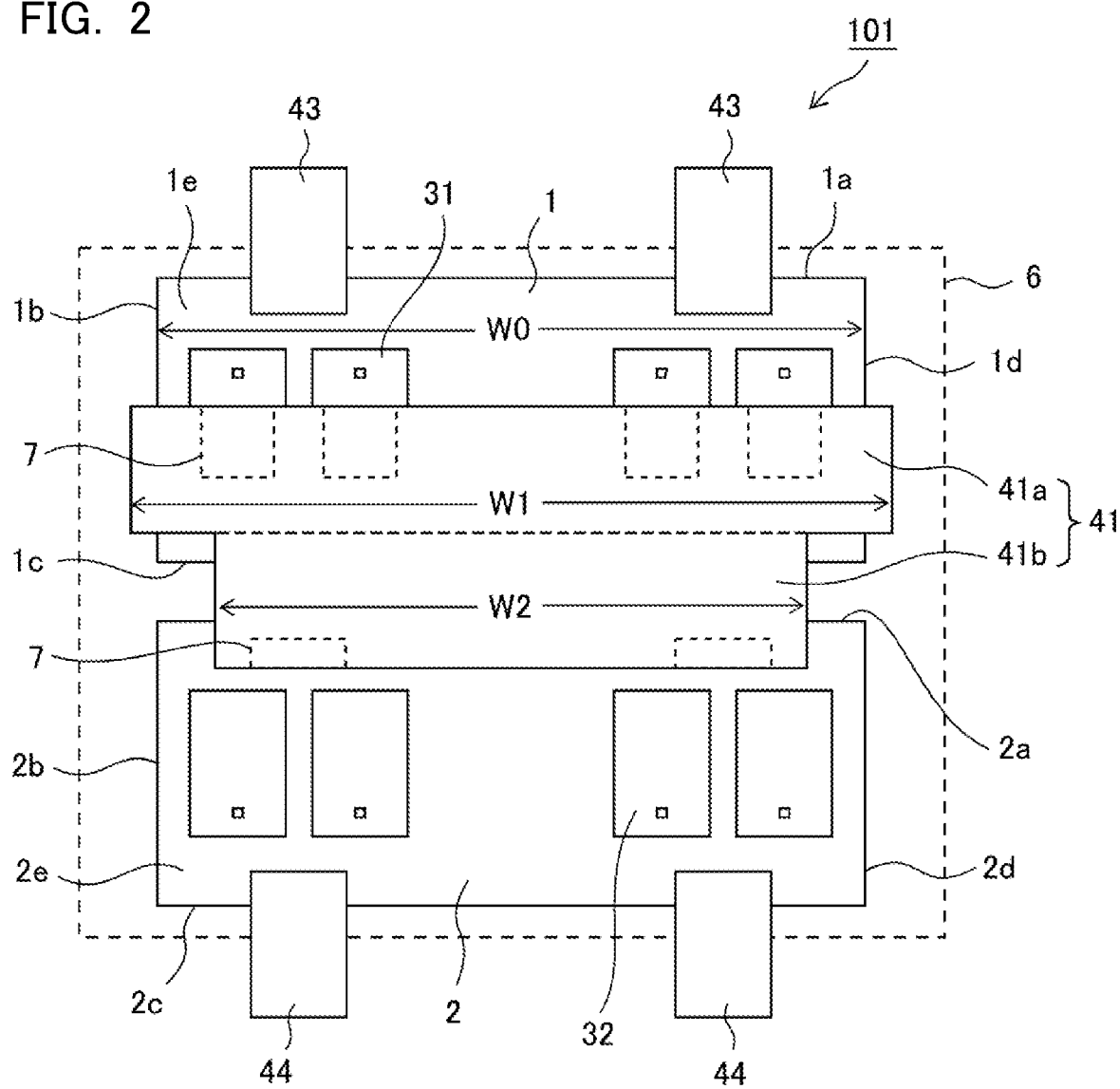
FIG. 2 is a plan view showing a state in which a second lead frame is removed from the power semiconductor module according to the first embodiment.
Figure 3:
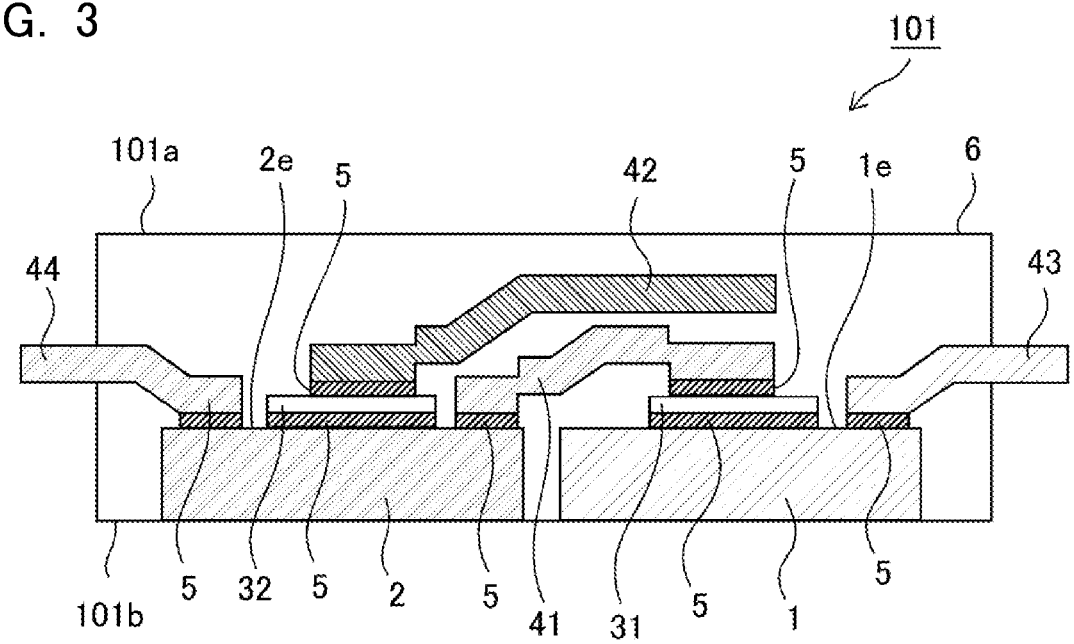
FIG. 3 is a sectional view showing a schematic structure of the power semiconductor module according to the first embodiment.

Hereinafter, a power semiconductor module which is a semiconductor device according to the first embodiment of the present disclosure will be described with reference to the drawings. FIG. 1 is a plan view showing a schematic structure of the power semiconductor module according to the first embodiment, FIG. 2 is a plan view showing a state in which a second lead frame is removed from the power semiconductor module shown in FIG. 1, and FIG. 3 is a sectional view of a part indicated by A-A in FIG. 1. In the drawings, the same or corresponding parts are denoted by the same reference characters.

As shown in FIG. 1 to FIG. 3, a power semiconductor module 101 according to the first embodiment includes a first metal wiring layer 1 and a second metal wiring layer 2 (which are collectively referred to as metal wiring layers), first power semiconductor elements 31 and second power semiconductor elements 32 (which are collectively referred to as power semiconductor elements), a first lead frame 41, a second lead frame 42, third lead frames 43, and fourth lead frames 44 (which are collectively referred to as lead frames) serving as a wiring member, joining materials 5, and sealing resin 6.

In the following description, the upper side in the drawing sheet of FIG. 3 is referred to as "upper" and the surface on the upper side of the power semiconductor module 101 shown in FIG. 3 is referred to as an upper surface 101a. However, as used herein, the upper surface 101a does not mean a surface to be placed on the upper side in use and thus is not relevant to the gravity direction. FIG. 1 and FIG. 2 are plan views when the power semiconductor module 101 shown in FIG. 3 is seen from the upper surface 101a side (i.e., top view), and show the internal structure as seen through the sealing resin 6. In the drawings, an outer frame indicated by a dotted line represents the sealing resin 6.

The first metal wiring layer 1 and the second metal wiring layer 2 are planar members serving as a base of the entire power semiconductor module 101, and have rectangular shapes in a top view as shown in FIG. 2. The first metal wiring layer 1 and the second metal wiring layer 2 each have two main surfaces opposed to each other and four end surfaces connecting the two main surfaces, and are arranged side by side with each other.

The first metal wiring layer 1 has, as the four end surfaces, a first end surface 1a and a third end surface 1c opposed to each other and a second end surface 1b and a fourth end surface 1d opposed to each other. The first end surface 1a and the third end surface 1c are end surfaces along the long-side direction. The first end surface 1a and the third end surface 1c opposed to each other are parallel to each other, and the second end surface 1b and the fourth end surface 1d opposed to each other are parallel to each other.

Similarly, the second metal wiring layer 2 has, as the four end surfaces, a fifth end surface 2a and a seventh end surface 2c opposed to each other and a sixth end surface 2b and an eighth end surface 2d opposed to each other. The fifth end surface 2a and the seventh end surface 2c are end surfaces along the long-side direction. The fifth end surface 2a and the seventh end surface 2c opposed to each other are parallel to each other, and the sixth end surface 2b and the eighth end surface 2d opposed to each other are parallel to each other.

The main surface 1e of the first metal wiring layer 1 and the main surface 2e of the second metal wiring layer 2 are parallel to each other and the normal directions thereof are equal to each other. Therefore, a "direction perpendicular to one main surface 1e of the first metal wiring layer 1" which will be mentioned many times in the following description is the same as a "direction perpendicular to one main surface 2e of the second metal wiring layer 2", and both mean a "normal direction of the main surface of the metal wiring layer".

As shown in FIG. 3, where the direction perpendicular to one main surface 1e of the first metal wiring layer 1 is defined as a height direction, the first metal wiring layer 1 and the second metal wiring layer 2 have an equal dimension in the height direction, and the main surface 1e and the main surface 2e thereof are in the same plane. However, the shapes of the metal wiring layers are not limited thereto. Their shapes may not necessarily be a perfect rectangular shape in a top view, and the height-direction dimensions of the first metal wiring layer 1 and the second metal wiring layer 2 may not necessarily be the same.

As the material for the metal wiring layers, metal having high electric property and high mechanical property is used. For example, aluminum (Al), copper (Cu), silver (Ag), nickel (Ni), gold (Au), an alloy containing two or more of them, a composite material (Al—SiC) containing silicon carbide and aluminum, or the like is suitable. However, the material of the first metal wiring layer 1 and the second metal wiring layer 2 is not limited thereto.

The first power semiconductor elements 31 are joined to one main surface 1e of the first metal wiring layer 1. The second power semiconductor elements 32 are joined to one main surface 2e of the second metal wiring layer 2 that is located on the same side (i.e., upper side) as the one main surface 1e of the first metal wiring layer 1. As the power semiconductor elements, for example, an insulated gate bipolar transistor (IGBT), a free wheel diode (FWD), a metal oxide semiconductor field effect transistor (MOSFET), or the like is used.

As shown in FIG. 2, the power semiconductor elements have rectangular shapes in a plan view. As the first power semiconductor elements 31, four power semiconductor elements are arranged in a line at intervals from each other at the first metal wiring layer 1. Similarly, as the second power semiconductor elements 32, four power semiconductor elements are arranged at the second metal wiring layer 2. However, the type, the number, and the arrangement of the power semiconductor elements are not limited thereto. In addition, control wiring electrodes and control wires are arranged on the power semiconductor elements, but they are not shown and the description thereof is omitted here.

The power semiconductor module 101 includes a wiring member joined to one or more of the first metal wiring layer 1, the second metal wiring layer 2, the first power semiconductor elements 31, and the second power semiconductor elements 32. The wiring member includes the first lead frame 41, the second lead frame 42, the third lead frames 43, and the fourth lead frames 44.

One end of the first lead frame 41 is joined to one main surface 2e of the second metal wiring layer 2, and another end thereof is joined to a surface electrode of each first power semiconductor element 31. One end of the second lead frame 42 is joined to a surface electrode of each second power semiconductor element 32, and another end thereof is exposed from the sealing resin 6. One end of the third lead frame 43 is joined to the main surface 1e of the first metal wiring layer 1, and another end thereof is exposed from the sealing resin 6. One end of the fourth lead frame 44 is joined to the main surface 2e of the second metal wiring layer 2, and another end thereof is exposed from the sealing resin 6.

As the material of the lead frames, metal having high electric conductivity is used. For example, copper (Cu), aluminum (Al), an alloy containing at least one of them, or the like is suitable. However, the material of the lead frames is not limited thereto.

The joining materials 5 are provided at a joining part between the metal wiring layer and the power semiconductor element or the lead frame, and at a joining part between the power semiconductor element and the lead frame. As the joining materials 5, for example, solder for high temperature containing lead (Pb) and tin (Sn), silver (Ag) nanoparticle paste, a conductive adhesive containing silver particles and epoxy resin, or the like is used.

The sealing resin 6 seals the first metal wiring layer 1, the second metal wiring layer 2, the first power semiconductor elements 31, the second power semiconductor elements 32, and at least a part of the wiring member. As the material of the sealing resin 6, for example, epoxy resin, urethane resin, silicon resin, polyimide resin, polyamide resin, polyamide-imide resin, acrylic resin, a rubber material, or the like is used. The sealing resin 6 may be formed by overlaying a plurality of resin materials, e.g., gel-like silicon resin and gel-like epoxy resin. The types of the joining material 5 and the sealing resin 6 are not limited thereto.

Next, potentials that components of the power semiconductor module 101 have will be described with reference to FIG. 3. In FIG. 3, parts having equal potentials are indicated by the same types of hatching. The first metal wiring layer 1 and the second metal wiring layer 2 have different potentials. For example, the first metal wiring layer 1 has a P-side potential, and the second metal wiring layer 2 has an AC-side potential.

Each lead frame has a potential equal to that of the metal wiring layer or the power semiconductor element joined thereto. That is, the third lead frames 43 joined to the first metal wiring layer 1 have the P-side potential, and the first lead frame 41 and the fourth lead frames 44 joined to the second metal wiring layer 2 have the AC-side potential. The second lead frame 42 joined to the second power semiconductor elements 32 has an N-side potential.

As shown in FIG. 3, in the direction perpendicular to one main surface 1e of the first metal wiring layer 1, the first lead frame 41 is provided between the second lead frame 42 and the first power semiconductor element 31. In this way, the first lead frame 41 and the second lead frame 42 through which currents flow in opposite directions are arranged so as to overlap each other, whereby inductances are canceled out with each other, so that the inductance inside the power semiconductor module 101 is reduced. Further, the first lead frame 41 and the second lead frame 42 have parts overlapping in parallel with each other, in the direction perpendicular to one main surface 1e of the first metal wiring layer 1. As used herein, "parallel" may mean substantially parallel.

In the direction perpendicular to one main surface 1e of the first metal wiring layer 1, each of the first lead frame 41 and the second lead frame 42 is provided so as not to overlap parts of the end surfaces of the first metal wiring layer 1 and the second metal wiring layer 2. In other words, each of the first metal wiring layer 1 and the second metal wiring layer 2 has an end surface part that does not overlap the first lead frame 41 and the second lead frame 42. Thus, in a manufacturing process before sealing with the sealing resin 6, parts of the end surfaces of the first metal wiring layer 1 and the second metal wiring layer 2 are visible in a top view.

More specifically, it is desirable that, in the direction perpendicular to one main surface 1e of the first metal wiring layer 1, each of the first lead frame 41 and the second lead frame 42 is provided so as not to overlap a part of at least one of the first end surface 1a and the third end surface 1c of the first metal wiring layer 1, a part of at least one of the second end surface 1b and the fourth end surface 1d thereof, a part of at least one of the fifth end surface 2a and the seventh end surface 2c of the second metal wiring layer 2, and a part of at least one of the sixth end surface 2b and the eighth end surface 2d thereof.

That is, in the direction perpendicular to one main surface 1e of the first metal wiring layer 1, each of the first lead frame 41 and the second lead frame 42 may be provided so as not to overlap a part of the end surface along the long-side direction and a part of the end surface along the short-side direction of each of the first metal wiring layer 1 and the second metal wiring layer 2. In addition, the end surface along the long-side direction and the end surface along the short-side direction are included in a corner of the metal wiring layer 1. Therefore, each of the first lead frame 41 and the second lead frame 42 may be provided so as not to overlap at least one corner of each of the first metal wiring layer 1 and the second metal wiring layer 2.

Thus, in the manufacturing process before sealing with the sealing resin 6, at least one corner of each of the first metal wiring layer 1 and the second metal wiring layer 2 is visible in a top view. In the example shown in FIG. 1, two corners 1f, 1g of the first metal wiring layer 1 and four corners 2f, 2g, 2h, 2i of the second metal wiring layer 2 are visible.

The first metal wiring layer 1 and the second metal wiring layer 2 are arranged such that the third end surface 1c and the fifth end surface 2a which are their respective end surfaces along the long-side direction are opposed to each other. Where a direction parallel to one main surface 1e of the first metal wiring layer 1 and parallel to the end surface along the long-side direction thereof is defined as a width direction, the first lead frame 41 and the second lead frame 42 have large-width areas 41a, 42a whose dimensions in the width direction are larger than the dimensions in the width direction of the first metal wiring layer 1 and the second metal wiring layer 2.

Since the power semiconductor module 101 uses large current, it is desirable that the dimensions in the width direction of the lead frames are large, and therefore it is suitable that the first lead frame 41 and the second lead frame 42 are formed in plate shapes having larger dimensions in the width direction than the metal wiring layers. In addition, when the first lead frame 41 and the second lead frame 42 have the large-width areas 41a, 42a, the inductance reducing effect by arranging them so as to overlap each other becomes great.

In addition, the first lead frame 41 and the second lead frame 42 have small-width areas 41b, 42b whose dimensions in the width direction are smaller than the dimensions in the width direction of the first metal wiring layer 1 and the second metal wiring layer 2. In the example shown in FIG. 1 and FIG. 2, the left-right direction of the drawing sheet is the width direction, and the first metal wiring layer 1 and the second metal wiring layer 2 have an equal dimension in the width direction (which is denoted by W0).

As shown in FIG. 2, the first lead frame 41 has the large-width area 41a and the small-width area 41b having different dimensions in the width direction. A dimension W1 in the width direction of the large-width area 41a is larger than the dimension W0 in the width direction of the metal wiring layers, and a dimension W2 in the width direction of the small-width area 41b is smaller than the dimension W0 in the width direction of the metal wiring layers (W2<W0<W1).

As shown in FIG. 1, the second lead frame 42 has the large-width area 42a and the small-width area 42b having different dimensions in the width direction. A dimension W3 in the width direction of the large-width area 42a is larger than the dimension W0 in the width direction of the metal wiring layers, and a dimension W4 in the width direction of the small-width area 42b is smaller than the dimension W0 in the width direction of the metal wiring layers (W4<W0<W3). It is desirable that the dimensions in the width direction of the small-width areas 41b, 42b of the first lead frame 41 and the second lead frame 42 are smaller than the dimension W0 in the width direction of the metal wiring layers by 1 mm or more and less than 5 mm. However, these dimensions are not limited and may be changed as appropriate.

In the example shown in FIG. 1, since the first lead frame 41 and the second lead frame 42 have the small-width areas 41b, 42b, in the manufacturing process before sealing with the sealing resin 6, two corners 1f, 1g of the first metal wiring layer 1 and two corners 2f, 2g of the second metal wiring layer 2 are visible in a top view.

As described above, in the direction perpendicular to one main surface 1e of the first metal wiring layer 1, each of the first lead frame 41 and the second lead frame 42 is provided so as not to overlap parts of the end surfaces of the metal wiring layers, whereby, in the manufacturing process before sealing with the sealing resin 6, parts of the end surfaces of the metal wiring layers are visible in a top view. Thus, these end surfaces can be used for confirmation of the positions of the metal wiring layers, confirmation of the positional relationship between the metal wiring layer and the lead frame, or the like. Further, since the end surfaces along the long-side direction and the end surfaces along the short-side direction of the metal wiring layers are visible in a top view, it is possible to confirm the positions in the width direction of the metal wiring layers and the positions thereof in the depth direction perpendicular to the width direction.

Accordingly, in the manufacturing process for the power semiconductor module 101, it is possible to perform positioning between the lead frames and between the metal wiring layer and the lead frame, using the end surfaces. Specifically, in a joining process between the metal wiring layer and the lead frame, positioning between the metal wiring layer and the lead frame can be easily performed. In addition, in a resin sealing process after the metal wiring layers and the lead frames are integrated, at the time of pressing the metal wiring layer by a pin from the upper side, positioning between the metal wiring layer and the pin can be easily performed.

Meanwhile, a lead frame of a power semiconductor module in conventional art has a connection portion which extends away from an end of the lead frame and is bent, as a part to be joined to a metal wiring layer or a power semiconductor element. Thus, the plane area in a direction parallel to the main surface 1e of the metal wiring layer increases, thus causing a problem of enlarging the size of the power semiconductor module.

In order to solve the above problem, in the power semiconductor module 101 according to the first embodiment, the first lead frame 41 and the second lead frame 42 have, at their ends, protrusions 7 protruding perpendicularly toward surfaces of joining targets, and are joined to the joining targets at the protrusions 7. At least one protrusion 7, or desirably three or more protrusions 7, are formed on a surface of an end of each lead frame on the side to be joined to the metal wiring layer or the power semiconductor element.

As shown in FIG. 2, the first lead frame 41 has two protrusions 7 as joining portions to the second metal wiring layer 2, and four protrusions 7 as joining portions to the first power semiconductor elements 31. As shown in FIG. 1, the second lead frame 42 has four protrusions 7 as joining portions to the second power semiconductor elements 32.

As a method for forming the protrusions 7, boss portions may be formed by press working or the like without changing the lead frame thickness, or the lead frame may be formed to be partially thick, for example. In any case, the protrusions 7 are formed at the same time as the lead frame and are formed integrally with the lead frame. The first lead frame 41 and the second lead frame 42 are each joined to the metal wiring layer or the power semiconductor element by each protrusion 7 closely contacting with the joining material 5.

Figure 4:
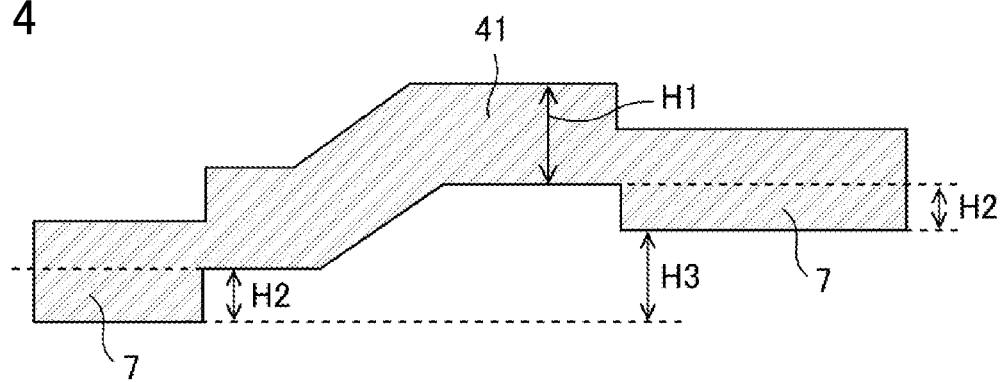
FIG. 4 is a sectional view showing a first lead frame of the power semiconductor module according to the first embodiment.

FIG. 4 is a sectional view showing the first lead frame. Where the direction perpendicular to one main surface 1e of the first metal wiring layer 1 is defined as a height direction, in the drawing, H1 denotes the dimension in the height direction of the lead frame, H2 denotes the dimension in the height direction of the protrusion 7, and H3 denotes a height difference between the protrusions 7. The dimension H1 in the height direction of the lead frame is, for example, about 0.5 mm to 1.0 mm. It is desirable that the dimension H2 in the height direction of the protrusion 7 is about 0.3 times to 0.5 times the dimension H1 in the height direction of the lead frame.

The surface of the first power semiconductor element 31 is higher than the main surface 2e of the second metal wiring layer 2 by an amount corresponding to the joining material 5 and the body of the first power semiconductor element 31. Therefore, the heights of the protrusions 7 of the first lead frame 41 need to be different between the part to be joined to the first power semiconductor element 31 and the part to be joined to the second metal wiring layer 2. It is desirable that a height difference H3 between the protrusions 7 formed on the first lead frame 41 (or second lead frame 42) is 450 μm to 750 μm. This makes it easy to join the first lead frame 41 to the first power semiconductor element 31 and the second metal wiring layer 2.

As described above, in the power semiconductor module 101 according to the first embodiment, the first lead frame 41 and the second lead frame 42 through which currents flow in opposite directions are arranged so as to overlap each other in the direction perpendicular to one main surface 1e of the first metal wiring layer 1, whereby the internal inductance can be reduced. The first lead frame 41 and the second lead frame 42 have parts overlapping in parallel with each other, whereby the inductance reducing effect is further increased.

In addition, in the direction perpendicular to one main surface 1e of the first metal wiring layer 1, each of the first lead frame 41 and the second lead frame 42 is provided so as not to overlap parts of end surfaces of the first metal wiring layer 1 and the second metal wiring layer 2, whereby, in the manufacturing process for the power semiconductor module 101 before sealing with the sealing resin 6, it is possible to confirm the positions of the metal wiring layers, the positional relationship between the lead frames, and the positional relationship between the metal wiring layer and the lead frame, in a top view.

In addition, each of the first lead frame 41 and the second lead frame 42 is provided so as not to overlap a part of the end surface along the long-side direction and a part of the end surface along the short-side direction of each of the first metal wiring layer 1 and the second metal wiring layer 2, whereby it is possible to confirm the positions in the width direction and the positions in the depth direction of the first metal wiring layer 1 and the second metal wiring layer 2, in a top view. Thus, in the manufacturing process for the power semiconductor module 101, it is possible to easily perform positioning between the lead frames and between the metal wiring layer and the lead frame, using the end surfaces, whereby the manufacturing process can be simplified.

Further, the first lead frame 41 and the second lead frame 42 each have the protrusion 7 protruding perpendicularly toward the surface of a joining target. Thus, as compared to the case of having the conventional connection portion that extends away from the lead frame end and is bent, increase in the plane area in the direction parallel to the main surface 1e of the metal wiring layer can be suppressed, so that the power semiconductor module 101 is downsized. In addition, since the protrusions 7 are formed at the same time as formation of the lead frames, the manufacturing process is not complicated and the manufacturing cost is not increased.

Second Embodiment

Figure 5:
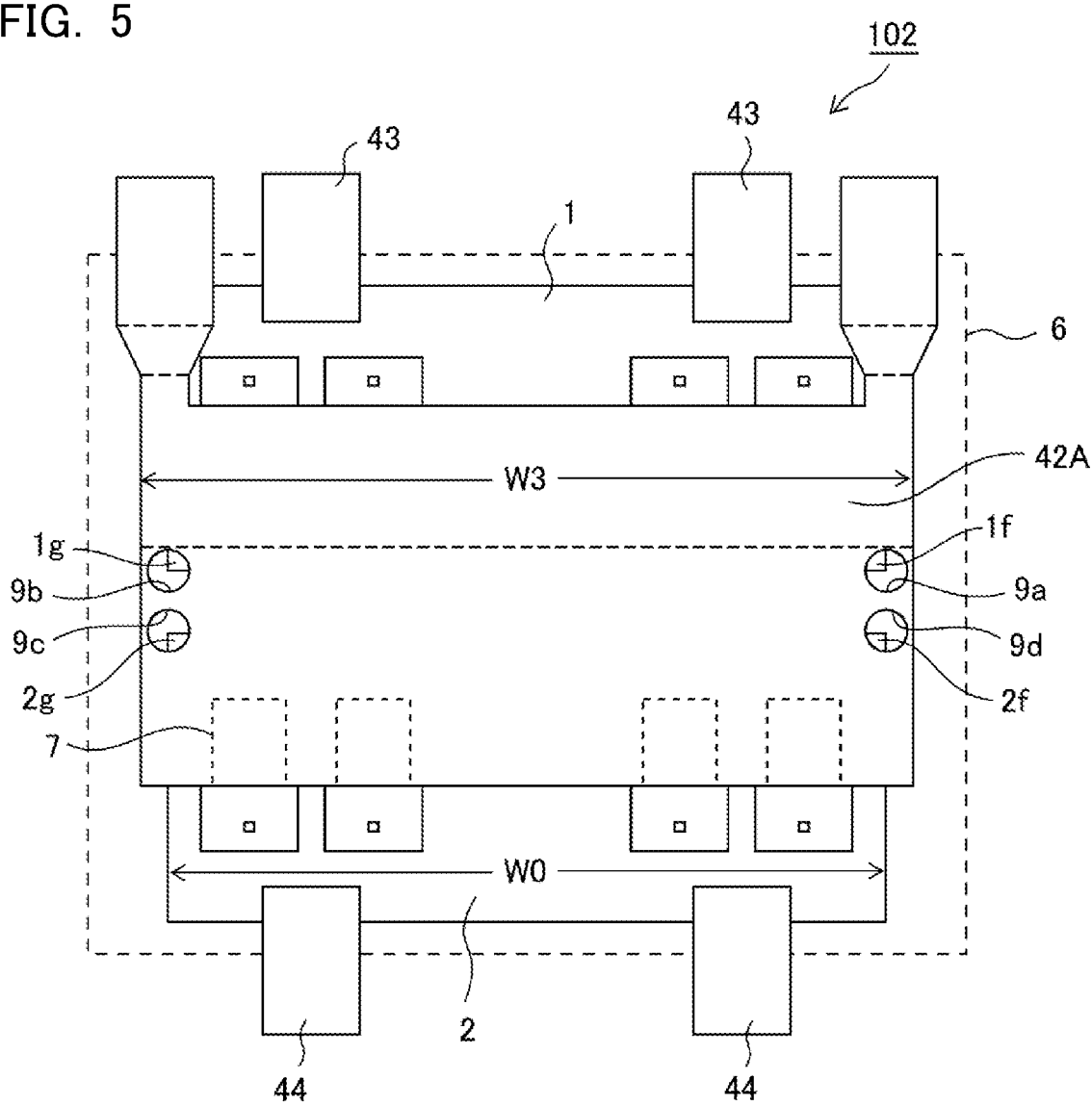
FIG. 5 is a plan view showing a schematic structure of a power semiconductor module according to the second embodiment of the present disclosure.
Figure 6:
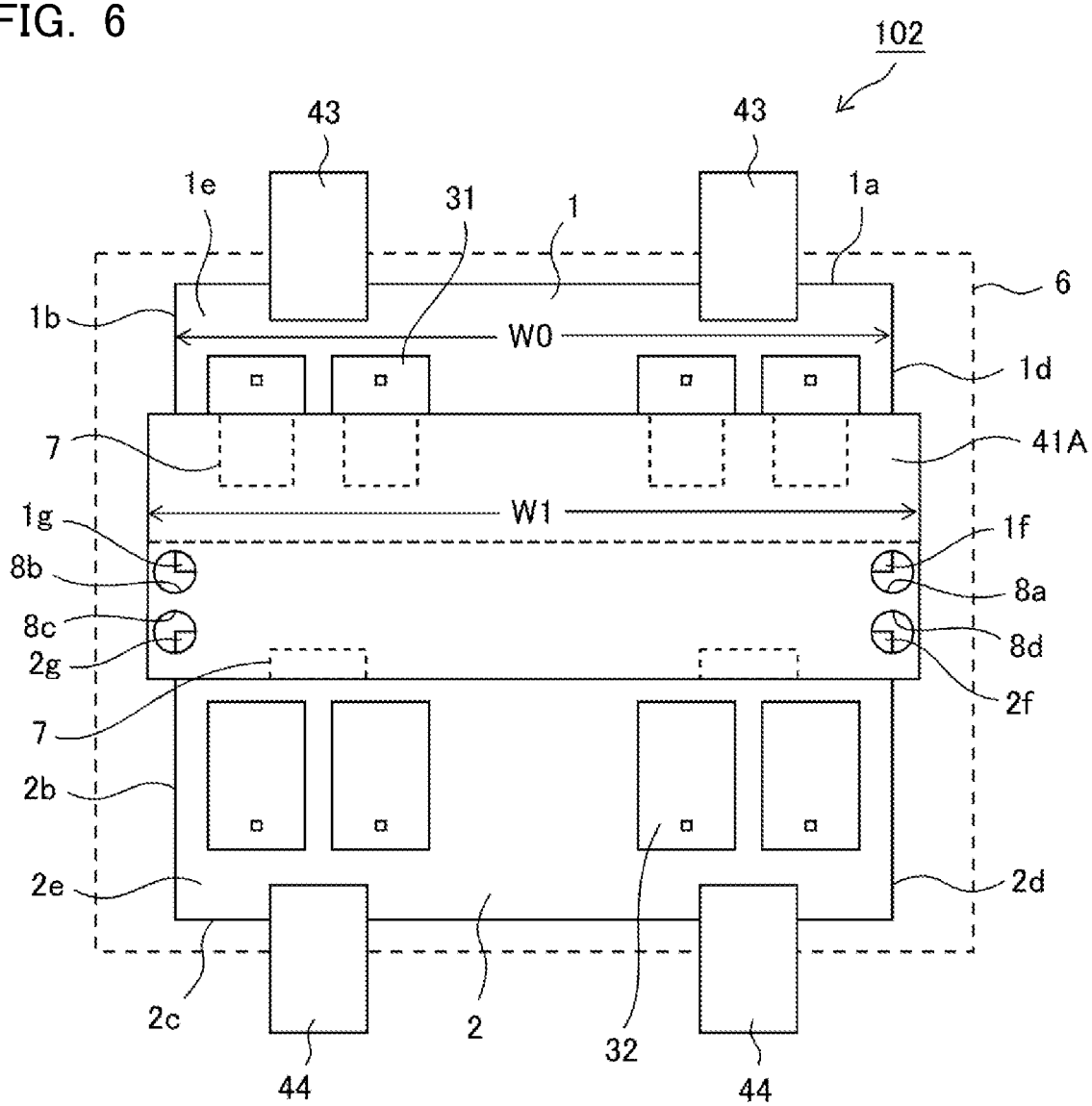
FIG. 6 is a plan view showing a state in which a second lead frame is removed from the power semiconductor module according to the second embodiment.

FIG. 5 is a plan view showing a schematic structure of a power semiconductor module according to the second embodiment of the present disclosure, and FIG. 6 is a plan view showing a state in which a second lead frame is removed from the power semiconductor module shown in FIG. 5. A sectional view of a power semiconductor module 102 according to the second embodiment is the same as that of the power semiconductor module 101 according to the above first embodiment, and therefore FIG. 3 is used also here. FIG. 5 and FIG. 6 are plan views when the power semiconductor module 102 is seen from the upper surface 101a (see FIG. 3) side (i.e., a top view), and show the internal structure as seen through the sealing resin 6. In the drawings, an outer frame indicated by a dotted line represents the sealing resin 6.

In the above first embodiment, the first lead frame 41 and the second lead frame 42 have the small-width areas 41b, 42b, whereby two corners 1f, 1g of the first metal wiring layer 1 and two corners 2f, 2g of the second metal wiring layer 2 are visible in a top view (see FIG. 1). Thus, in the manufacturing process before sealing with the sealing resin 6, it is possible to confirm the positions of the metal wiring layers, the positional relationship between the lead frames, the positional relationship between the metal wiring layer and the lead frame, and the like, in a top view (see FIG. 1).

On the other hand, in the power semiconductor module 102 according to the second embodiment, a first lead frame 41A and a second lead frame 42A have openings which are through holes, thereby providing the same effects as in the case of providing the small-width areas 41b, 42b. The other configurations of the power semiconductor module 102 according to the second embodiment are the same as in the power semiconductor module 101 according to the above first embodiment, and therefore the description thereof is omitted here.

As shown in FIG. 5 and FIG. 6, the first metal wiring layer 1 and the second metal wiring layer 2 are arranged such that the third end surface 1c and the fifth end surface 2a which are their respective end surfaces along the long-side direction are opposed to each other. Where a direction parallel to one main surface 1e of the first metal wiring layer 1 and parallel to the end surface along the long-side direction thereof is defined as a width direction, the first lead frame 41A and the second lead frame 42A have large-width areas whose dimensions in the width direction are larger than the dimensions in the width direction of the first metal wiring layer 1 and the second metal wiring layer 2. The dimensions W1, W3 in the width direction of the large-width areas are larger than the dimension W0 in the width direction of the first metal wiring layer 1 and the second metal wiring layer 2 (W0<W1, W0<W3).

The first lead frame 41A and the second lead frame 42A have openings provided so as to overlap parts of the end surfaces of the first metal wiring layer 1 and the second metal wiring layer 2, in the direction perpendicular to one main surface 1e of the first metal wiring layer 1. The first lead frame 41A has four openings 8a, 8b, 8c, 8d, as shown in FIG. 6. The four openings 8a, 8b, 8c, 8d respectively overlap the corners 1f, 1g of the first metal wiring layer 1 and the corners 2f, 2g of the second metal wiring layer 2.

The second lead frame 42A has four openings 9a, 9b, 9c, 9d, as shown in FIG. 5. The four openings 9a, 9b, 9c, 9d respectively overlap the four openings 8a, 8b, 8c, 8d of the first lead frame 41A, and overlap the corners 1f, 1g of the first metal wiring layer 1 and the corners 2f, 2g of the second metal wiring layer 2.

That is, the openings of the first lead frame 41A and the second lead frame 42A are provided at such positions that overlap at least one corner of the first metal wiring layer 1 and at least one corner of the second metal wiring layer 2, in the direction perpendicular to one main surface 1e of the first metal wiring layer 1.

Figure 7:
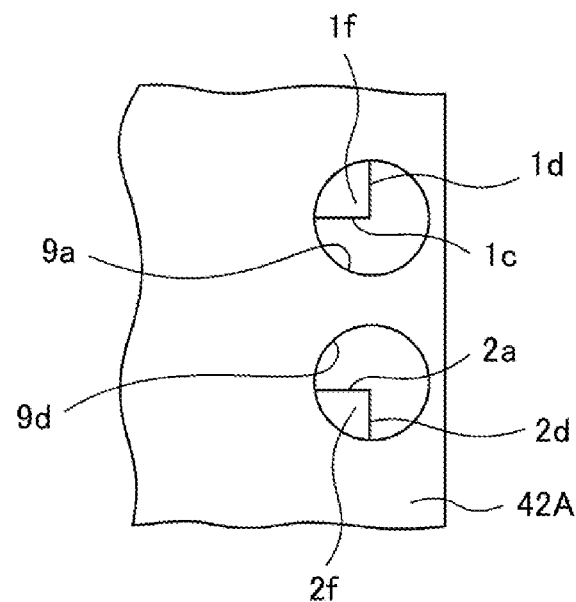
FIG. 7 is a partial enlarged view showing openings provided to a lead frame of the power semiconductor module according to the second embodiment.

FIG. 7 is a partial enlarged view showing openings provided to the lead frame of the power semiconductor module according to the second embodiment. As shown in FIG. 7, the opening 9a of the second lead frame 42A (and the opening 8a of the first lead frame 41A which is not shown) is provided at a position that overlaps the corner if of the first metal wiring layer 1. The third end surface 1c along the long-side direction and the fourth end surface 1d along the short-side direction are included in the corner if of the first metal wiring layer 1.

In addition, the opening 9d of the second lead frame 42A (and the opening 8d of the first lead frame 41A which is not shown) is provided at a position that overlaps the corner 2f of the second metal wiring layer 2. The fifth end surface 2a along the long-side direction and the eighth end surface 2d along the short-side direction are included in the corner 2f of the second metal wiring layer 2. Thus, each of the first lead frame 41A and the second lead frame 42A is provided so as not to overlap a part of the end surface along the long-side direction and a part of the end surface along the short-side direction of each of the first metal wiring layer 1 and the second metal wiring layer 2, in the direction perpendicular to one main surface 1e of the first metal wiring layer 1.

Thus, in the power semiconductor module 102 according to the second embodiment, in the manufacturing process before sealing with the sealing resin 6, it is possible to confirm the positions in the width direction and the positions in the depth direction of the first metal wiring layer 1 and the second metal wiring layer 2, through the openings provided to the first lead frame 41A and the second lead frame 42A, in a top view.

In the example shown in FIG. 5 and FIG. 6, four openings having a circular shape in a top view are provided to each of the first lead frame 41A and the second lead frame 42A. However, the shape and the number of the openings are not limited thereto, and the openings may have an elliptic shape or a rectangular shape, for example.

In the power semiconductor module 102 according to the second embodiment, the same effects as in the power semiconductor module 101 according to the above first embodiment can be provided. In addition, since the openings are provided to the lead frames instead of providing the small-width areas, it is possible to make the areas of the large-width areas of the lead frame larger than those in the power semiconductor module 101 according to the above first embodiment.

Third Embodiment

Figure 8:
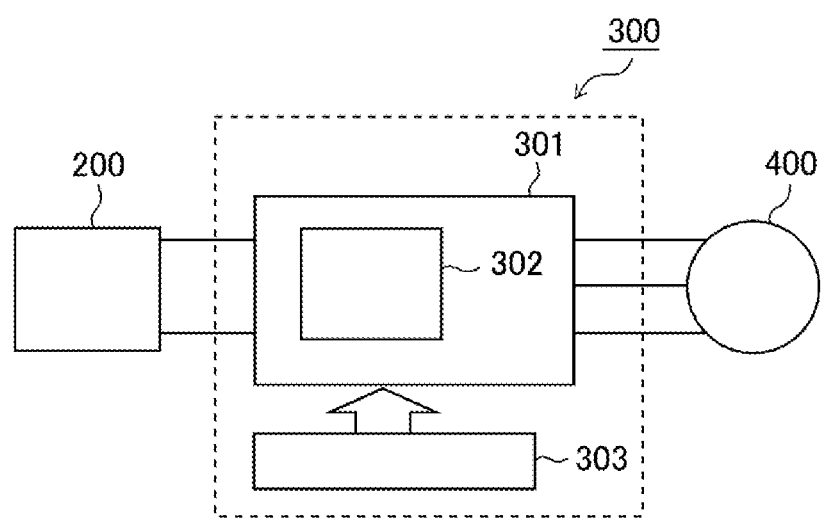
FIG. 8 illustrates a configuration of a power conversion system including a power conversion device according to the third embodiment of the present disclosure.

FIG. 8 illustrates a configuration of a power conversion system including a power conversion device according to the third embodiment of the present disclosure. In the third embodiment, the power conversion device in which the power semiconductor module 101, 102 according to the above first or second embodiment is applied to a three-phase inverter will be described.

The power conversion system includes a power supply 200, a power conversion device 300, and a load 400. The power supply 200 is a DC power supply that supplies DC power to the power conversion device 300. The power supply 200 may be formed by a DC grid, a solar battery, or a storage battery, for example. Alternatively, the power supply 200 may be formed by a rectification circuit or an AC/DC converter connected to an AC grid, or a DC/DC converter connected to a DC grid.

The power conversion device 300 is a three-phase inverter connected between the power supply 200 and the load 400. The power conversion device 300 converts DC power supplied from the power supply 200 to AC power and supplies the AC power to the load 400. The power conversion device 300 includes a main conversion circuit 301 for converting DC power to AC power and outputting the AC power, and a control circuit 303 for outputting a control signal to the main conversion circuit 301.

The load 400 is a three-phase electric motor driven by AC power supplied from the power conversion device 300. The load 400 is not limited to a specific application and is an electric motor mounted to various types of electric apparatuses. For example, the load 400 may be an electric motor of a hybrid vehicle, an electric vehicle, a railroad vehicle, an elevator, air conditioner equipment, or the like.

The main conversion circuit 301 includes switching elements and free wheel diodes, and converts DC power supplied from the power supply 200 to AC power through switching of the switching elements. While the main conversion circuit 301 may have various circuit configurations, in the third embodiment, a two-level three-phase full-bridge circuit composed of six switching elements and six free wheel diodes connected in antiparallel to the respective switching elements will be described.

As a power semiconductor module 302 of the main conversion circuit 301, either of the power semiconductor modules 101 and 102 according to the above first and second embodiments is used, thus forming any of the switching elements and the free wheel diodes of the main conversion circuit 301. Among the six switching elements, each two switching elements are connected in series and form upper and lower arms, and the respective pairs of the upper and lower arms form the respective phases (U phase, V phase, W phase) of the full-bridge circuit. Output terminals of the respective pairs of the upper and lower arms, i.e., three output terminals of the main conversion circuit 301 are connected to the load 400. Further, the main conversion circuit 301 includes a drive circuit (not shown) for driving the switching elements and the free wheel diodes.

The control circuit 303 controls the switching elements of the main conversion circuit 301 so that desired power is supplied to the load 400. Specifically, a period (ON period) during which each switching element of the main conversion circuit 301 is to be turned on is calculated on the basis of the power to be supplied to the load 400, and a corresponding control signal is outputted to the drive circuit. For example, the main conversion circuit 301 can be controlled through PWM control in which the ON periods for the switching elements are modulated in accordance with voltage to be outputted. On the basis of the control signal, the drive circuit outputs an ON signal or an OFF signal as a drive signal to the control electrode of each switching element.

In the power conversion device 300 according to the third embodiment, the power semiconductor module 101, 102 according to the first or second embodiment is applied as the switching elements and the free wheel diodes of the main conversion circuit 301, whereby size reduction can be achieved, and wire breakage due to vibration and thermal fatigue, etc., can be prevented.

In the third embodiment, the example in which the power semiconductor module 101, 102 according to the first or second embodiment is applied to a two-level three-phase inverter, has been described. However, without limitation thereto, for example, the power semiconductor module 101, 102 may be applied to a three-level or multilevel power conversion device or a single-phase inverter. In a case of supplying power to a DC load, the power semiconductor module 101, 102 may be applied to a DC/DC converter or an AC/DC converter.

The power conversion device 300 is not limited to an application in which the load 400 is an electric motor. For example, the power conversion device 300 can be used as a power supply device for an electric discharge working machine, a laser working machine, an induction heating cooking device, a contactless power supply system, or the like, and further, can be used as a power conditioner of a photovoltaic generation system, a power storage system, or the like.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

What is claimed is:

1. A semiconductor device comprising:
a first metal wiring layer and a second metal wiring layer having planar shapes and arranged side by side with each other, the first metal wiring layer and the second metal wiring layer each having two main surfaces opposed to each other and four end surfaces connecting the two main surfaces;
a first power semiconductor element joined to one main surface of the first metal wiring layer;
a second power semiconductor element joined to one main surface of the second metal wiring layer that is located on the same side as the one main surface of the first metal wiring layer;
a wiring member joined to one or more of the first metal wiring layer, the second metal wiring layer, the first power semiconductor element, and the second power semiconductor element; and
a sealing resin that seals the first metal wiring layer, the second metal wiring layer, the first power semiconductor element, the second power semiconductor element, and at least a part of the wiring member, wherein
the wiring member includes
a first lead frame having one end joined to the one main surface of the second metal wiring layer and another end joined to a surface electrode of the first power semiconductor element, and
a second lead frame having one end joined to a surface electrode of the second power semiconductor element and another end exposed from the sealing resin, and
in a direction perpendicular to the one main surface of the first metal wiring layer, the first lead frame is provided between the second lead frame and the first power semiconductor element, and each of the first lead frame and the second lead frame is provided so as not to overlap parts of the end surfaces of the first metal wiring layer and the second metal wiring layer,
wherein
the first metal wiring layer and the second metal wiring layer are arranged such that their respective end surfaces along a long-side direction are opposed to each other, and
where a direction parallel to the one main surface of the first metal wiring layer and parallel to the end surface along the long-side direction thereof is defined as a width direction, the first lead frame and the second lead frame have large-width areas whose dimensions in the width direction are larger than dimensions in the width direction of the first metal wiring layer and the second metal wiring layer, and
wherein
the first lead frame and the second lead frame have openings provided at such positions that overlap parts of the end surfaces of the first metal wiring layer and the second metal wiring layer, in the direction perpendicular to the one main surface of the first metal wiring layer.

2. The semiconductor device according to claim 1, wherein
the first lead frame and the second lead frame have small-width areas whose dimensions in the width direction are smaller than the dimensions in the width direction of the first metal wiring layer and the second metal wiring layer.

3. The semiconductor device according to claim 2, wherein
the dimensions in the width direction of the small-width areas are smaller than the dimensions in the width direction of the first metal wiring layer and the second metal wiring layer by 1 mm or more and less than 5 mm.

4. The semiconductor device according to claim 1, wherein
the openings are respectively provided at such positions that overlap at least one corner of the first metal wiring layer and at least one corner of the second metal wiring layer, in the direction perpendicular to the one main surface of the first metal wiring layer.

5. The semiconductor device according to claim 1, wherein
the first metal wiring layer has, as the four end surfaces, a first end surface and a third end surface opposed to each other and a second end surface and a fourth end surface opposed to each other, and
in the direction perpendicular to the one main surface of the first metal wiring layer, each of the first lead frame and the second lead frame is provided so as not to overlap a part of at least one of the first end surface and the third end surface and a part of at least one of the second end surface and the fourth end surface.

6. A semiconductor device comprising:
a first metal wiring layer and a second metal wiring layer having planar shapes and arranged side by side with each other, the first metal wiring layer and the second metal wiring layer each having two main surfaces opposed to each other and four end surfaces connecting the two main surfaces;
a first power semiconductor element joined to one main surface of the first metal wiring layer;
a second power semiconductor element joined to one main surface of the second metal wiring layer that is located on the same side as the one main surface of the first metal wiring layer;
a wiring member joined to one or more of the first metal wiring layer, the second metal wiring layer, the first power semiconductor element, and the second power semiconductor element; and
a sealing resin that seals the first metal wiring layer, the second metal wiring layer, the first power semiconductor element, the second power semiconductor element, and at least a part of the wiring member, wherein
the wiring member includes
a first lead frame having one end joined to the one main surface of the second metal wiring layer and another end joined to a surface electrode of the first power semiconductor element, and
a second lead frame having one end joined to a surface electrode of the second power semiconductor element and another end exposed from the sealing resin, and
in a direction perpendicular to the one main surface of the first metal wiring layer, the first lead frame is provided between the second lead frame and the first power semiconductor element, and each of the first lead frame and the second lead frame is provided so as not to overlap parts of the end surfaces of the first metal wiring layer and the second metal wiring layer, wherein
the second metal wiring layer has, as the four end surfaces, a fifth end surface and a seventh end surface opposed to each other and a sixth end surface and an eighth end surface opposed to each other, and
in the direction perpendicular to the one main surface of the first metal wiring layer, each of the first lead frame and the second lead frame is provided so as not to overlap a part of at least one of the fifth end surface and the seventh end surface and a part of at least one of the sixth end surface and the eighth end surface.

7. The semiconductor device according to claim 1, wherein
the first lead frame and the second lead frame have parts overlapping in parallel with each other, in the direction perpendicular to the one main surface of the first metal wiring layer.

8. A semiconductor device comprising:
a first metal wiring layer and a second metal wiring layer having planar shapes and arranged side by side with each other, the first metal wiring layer and the second metal wiring layer each having two main surfaces opposed to each other and four end surfaces connecting the two main surfaces;
a first power semiconductor element joined to one main surface of the first metal wiring layer;
a second power semiconductor element joined to one main surface of the second metal wiring layer that is located on the same side as the one main surface of the first metal wiring layer;
a wiring member joined to one or more of the first metal wiring layer, the second metal wiring layer, the first power semiconductor element, and the second power semiconductor element; and
a sealing resin that seals the first metal wiring layer, the second metal wiring layer, the first power semiconductor element, the second power semiconductor element, and at least a part of the wiring member, wherein
the wiring member includes
a first lead frame having one end joined to the one main surface of the second metal wiring layer and another end joined to a surface electrode of the first power semiconductor element, and
a second lead frame having one end joined to a surface electrode of the second power semiconductor element and another end exposed from the sealing resin, and
in a direction perpendicular to the one main surface of the first metal wiring layer, the first lead frame is provided between the second lead frame and the first power semiconductor element, and each of the first lead frame and the second lead frame is provided so as not to overlap parts of the end surfaces of the first metal wiring layer and the second metal wiring layer, wherein
each of the first lead frame and the second lead frame has, at the end thereof, a protrusion protruding perpendicularly toward a surface of a joining target, and is joined to the joining target at the protrusion.

9. The semiconductor device according to claim 8, wherein
where the direction perpendicular to the one main surface of the first metal wiring layer is defined as a height direction, a dimension in the height direction of the protrusion is 0.3 times to 0.5 times a dimension in the height direction of the first lead frame or the second lead frame.

10. The semiconductor device according to claim 8, wherein
three or more of the protrusions are formed on each of the first lead frame and the second lead frame, and
where the direction perpendicular to the one main surface of the first metal wiring layer is defined as a height direction, a difference in the height direction between the protrusions formed on the first lead frame or the second lead frame is 450 μm to 750 μm.

11. A power conversion device comprising:
a main conversion circuit which includes the semiconductor device according to claim 1 and which converts inputted power and outputs resultant power; and
a control circuit which outputs a control signal for controlling the main conversion circuit, to the main conversion circuit.

12. A power conversion device comprising:
a main conversion circuit which includes the semiconductor device according to claim 2 and which converts inputted power and outputs resultant power; and
a control circuit which outputs a control signal for controlling the main conversion circuit, to the main conversion circuit.

13. A power conversion device comprising:
a main conversion circuit which includes the semiconductor device according to claim 8 and which converts inputted power and outputs resultant power; and
a control circuit which outputs a control signal for controlling the main conversion circuit, to the main conversion circuit.

* * * * *